United States Patent [19]
Blodgett et al.

[11] Patent Number: 5,608,568
[45] Date of Patent: Mar. 4, 1997

[54] THIN FILM VANADIUM OXIDE SPATIAL LIGHT MODULATORS AND METHODS

[75] Inventors: David W. Blodgett, Ellicott City, Md.; Charles H. Lange, College Station, Tex.; Philip J. McNally, Woodbine; Donald D. Duncan, Silver Spring, both of Md.

[73] Assignee: The Johns Hopkins University, Baltimore, Md.

[21] Appl. No.: 225,847

[22] Filed: Apr. 11, 1994

[51] Int. Cl.$^6$ .................................................. G02F 1/01
[52] U.S. Cl. .......................... 359/288; 359/245; 359/248
[58] Field of Search ................................. 359/245, 288, 359/289, 246, 247, 248, 359, 360; 372/26

[56] References Cited

U.S. PATENT DOCUMENTS

| | | | |
|---|---|---|---|
| 4,283,113 | 8/1981 | Eden | 350/96.15 |
| 4,615,587 | 10/1986 | Krasutsky | 350/353 |
| 4,750,834 | 6/1988 | Fateley | 356/346 |
| 5,286,976 | 2/1994 | Cole | 250/349 |

Primary Examiner—Georgia Y. Epps
Assistant Examiner—Dawn-Marie Bey
Attorney, Agent, or Firm—Francis A. Cooch

[57] ABSTRACT

Vanadium dioxide ($VO_2$) based infrared spatial light modulators (SLM) in four embodiments are disclosed:
(1) A $VO_2$ thin film is deposited on a planar diode array. Each diode constitutes a "pixel" of the SLM. Power provided to a diode permits accurate thermal control about the thin film's hysteresis. Initial biasing of the diode array is required to the base of the $VO_2$'s hysteresis curve.
(2) & (3) $VO_2$ is deposited on a thermoelectric array which can be an array of doped lines of p and n type material or a conductive material between two electrical contacts. The pixels have the ability to both heat and cool the $VO_2$ film, thereby allowing the array to be operated in a bistable mode. Bistable operation requires external biasing to the center of the $VO_2$'s hysteresis curve.
(4) A $VO_2$ thin film deposited on a substrate which is spaced a distance, L, from an array of vertical-cavity surface-emitting lasers for heating the $VO_2$.

47 Claims, 5 Drawing Sheets

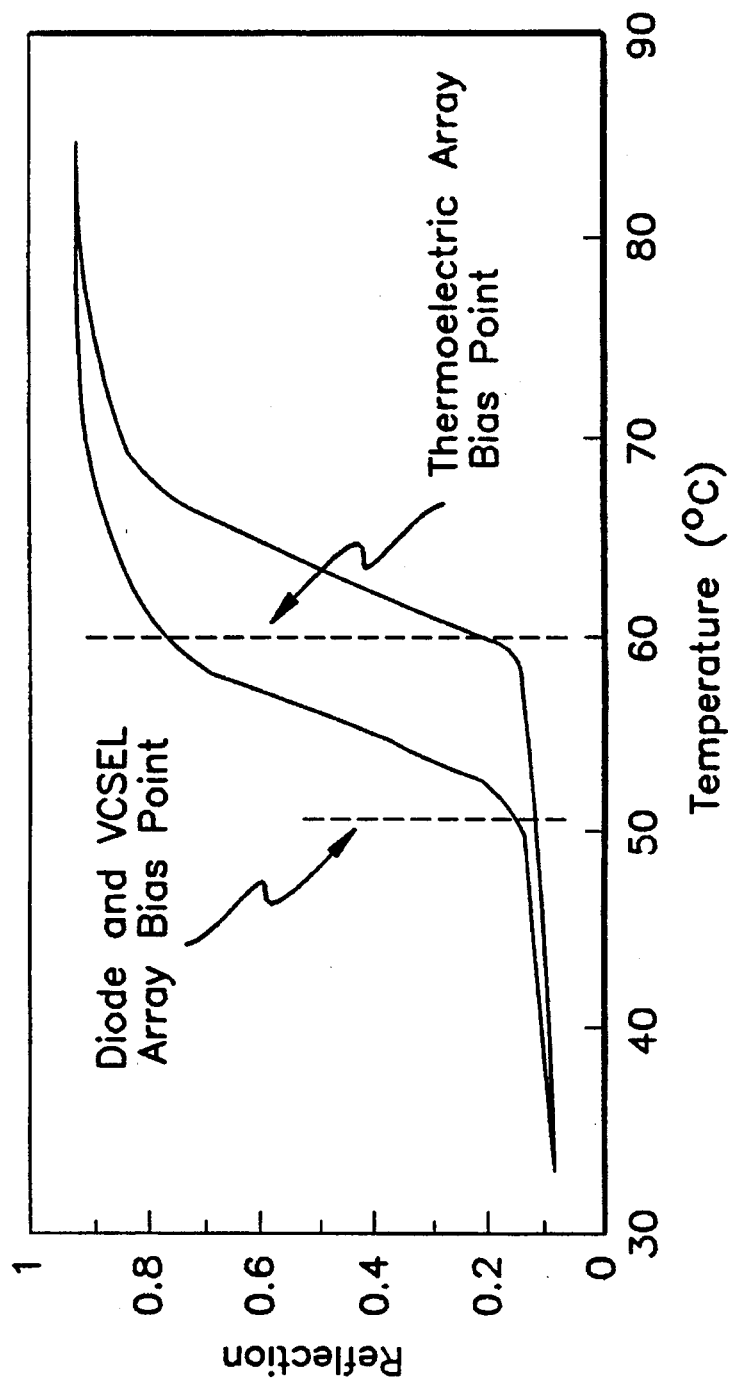

5,608,568

THIN FILM VANADIUM OXIDE SPATIAL LIGHT MODULATORS AND METHODS

STATEMENT OF GOVERNMENTAL INTEREST

The Government has rights in this invention pursuant to Contract No. N00039-91-0001 awarded by the Department of the Navy.

BACKGROUND OF THE INVENTION

The invention relates to spatial light modulators (SLMs) and, more specifically, to a vanadium oxide (VO) compound based SLM for the infrared (IR) range. (Note, the term VO is used herein throughout, including in the claims, as an acronym to refer to a vanadium oxide compound or compounds, in general; VO is not used herein as a chemical symbol referring only to vanadium monoxide.)

SLMs are real-time reconfigurable devices capable of modifying the amplitude (or intensity) of an optical wavefront as a function of spatial position. Electrical addressing of individual pixels in the SLM controls the reflection/transmission characteristics in the array. Applications of SLMs include scene simulation, dynamic spatial frequency filtering, analog multiplication and optical correlation.

There are very few options for SLMs within the mid and far IR. Mechanical modulators exist; however, they are fragile, very expensive, and capable only of imparting a phase change to the beam of light. Such devices are not usable in an image plane.

The only practical SLMs for the IR appear to be those using the vanadium oxides with the most useful being vanadium dioxide ($VO_2$). The VO compounds are heat-activated semiconductors with significantly different band gaps for different phases. Their characteristics are such that they act as dielectrics below a threshold temperature and conductors above this temperature.

The SLM designs described and claimed herein exploit the temperature dependent reflection/transmission characteristics of vanadium oxide (VO) thin films, i.e., the reflection increases as the temperature increases and the vanadium oxide becomes a narrow band gap semiconductor. When the temperature decreases the VO thin film becomes transmissive.

VO thin films exhibit a temperature dependent band gap and hysteresis about a transition temperature of approximately 60° C. This hysteresis is a result of a thermally induced atomic rearrangement in the $VO_2$'s crystalline structure changing it from a dielectric to conductive state. As noted, accompanying this transition is a change from a state of low to high reflectivity in the IR band.

The transformation or switching time between reflective states is a function of both the array's thermal design and the rate of energy injection into the thin film. Measured switching times have approached 30 nanoseconds with atomic rearrangement times estimated at less than 10 picoseconds.

FIG. 1 shows a model hysteresis curve which approximates the reflective characteristics of a 1000 Å $VO_2$ thin film at a wavelength of 4 μm. This hysteresis curve has a width of approximately 20° C. with reflectivity from 20% to almost 100%. The hysteresis' width, reflective contrast and slope are functions of the thin film's deposition technique, doping and substrate material.

There are several factors guiding the design of an SLM thermal array. The first is that the design must lend itself to the fabrication of a large, high resolution SLM. Each of the thermal pixels must provide accurate temperature control to the VO thin film. Accurate thermal control permits full mobility about the hysteresis curve. Because the $VO_2$'s reflective state is temperature dependent, care must be taken to limit thermal cross-talk between adjacent pixels as well as any temperature deviation across the array itself.

Other considerations include the temperature pulse itself, whose rise and fall times determine the maximum refresh rate of the SLM. Another consideration for the array design is the array substrate material. For the SLM to be used in the transmissive mode, the array substrate must have a high IR transmission so that the full reflective contrast of the VO compound is not partially masked. A reflective mode SLM requires that the array be either highly absorbing or transmissive. The most flexible SLM design will allow for use in either the reflective or transmissive mode. These and other considerations are met by the SLM embodiments described and claimed herein.

SUMMARY OF THE INVENTION

The SLM of the invention solves the above problems by depositing a temperature changing means on a substrate and then depositing on the temperature changing means a thin film of a vanadium oxide (VO) compound, preferably vanadium dioxide. When an electrical current is applied to the temperature changing means it will change the temperature of the VO compound deposited thereon causing an increase or decrease in the reflective value of the VO compound. The temperature changing means, depending on the embodiment, is an array of diodes, a thermoelectric array, or an array of vertical-cavity surface-emitting lasers. The resulting SLMs have substantially faster switching times and are much simpler and, hence, cheaper to make than current SLMs for the IR band.

BRIEF DESCRIPTION OF THE DRAWINGS

FIG. 1 illustrates a model hysteresis curve which approximates the reflective characteristics of a $VO_2$ thin film in the infrared range.

FIG. 3 is a chart showing the type of current/voltage required for a diode and thermoelectric array to achieve high and low reflectivity.

DESCRIPTION OF THE PREFERRED EMBODIMENTS

Generally, the SLM of the invention comprises a semiconductor substrate on which is deposited an array of temperature changing means. A thin film of a vanadium oxide (VO) compound, preferably vanadium dioxide ($VO_2$), is deposited on the temperature changing means array. An electrical current is then applied to one or more of the temperature changing means, each temperature changing means acting as a pixel. The electrical current causes the temperature changing means to change temperature thereby changing the reflective value of the VO compound deposited on the temperature changing means.

In another embodiment of the invention, an array of heating means is substituted for the temperature changing means. When electrical current is applied to one or more heating means, the heating means heats the VO compound causing its reflective value to increase. The temperature changing means and the heating means can be p-n junctions or vertical-cavity surface-emitting lasers.

Figure 2A:
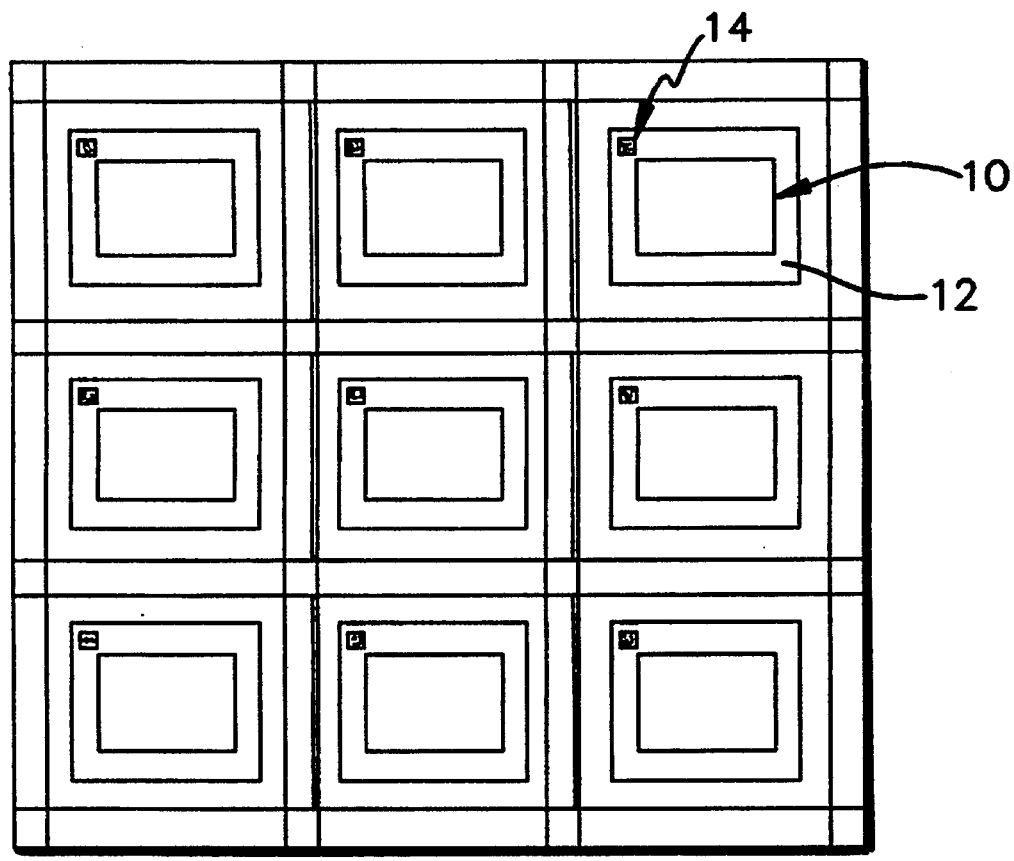
FIG. 2, consisting of FIGS. 2a, 2b and 2c, illustrates the diode-based embodiment of the invention.
Figure 2B:
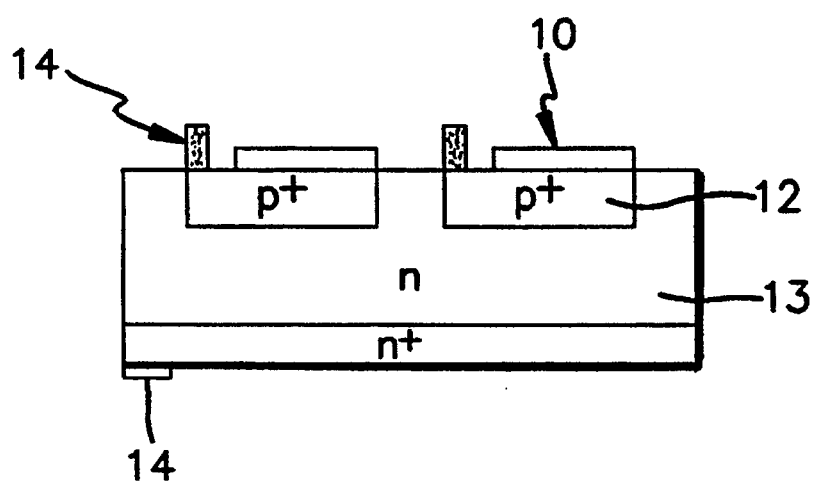
Figure 2C:
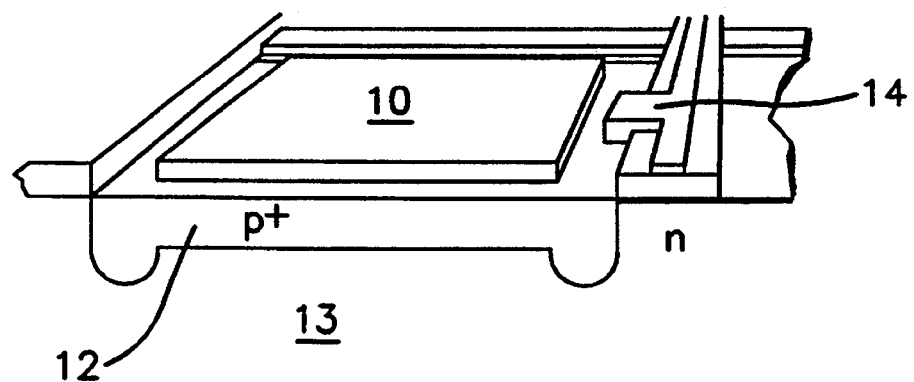

FIGS. 2a, 2b and 2c illustrate a first, diode-based embodiment of the invention. As shown, a VO compound thin film 10, preferably $VO_2$, is deposited on each diode 12 in an array of diodes. These diodes, which act as pixels, comprise p-n doped junctions and are deposited in a monolithic semiconductor substrate 13. While the diodes share a common substrate, they are electrically isolated by their individual electrical contacts 14. The electrical contacts can be made of, e.g., aluminum (Al).

Silicon was chosen as the semiconductor substrate both because of its manufacturing processes and excellent IR transmissive properties. Silicon is a very common fabrication material, is relatively inexpensive, and is compatible with high density array fabrication. This allows the SLM to incorporate only proven fabrication techniques. Another advantage that silicon has is that it is virtually transparent in the IR band. This transparency is crucial because it allows the SLM to meet the requirements of being either fully transmissive or fully reflective in the desired band and, in conjunction with a VO compound, provides a relatively large reflective contrast.

Diode heating occurs when a current, applied to the electrical contacts 14, passes between the p+ and n+ terminals. A shallow p+-n junction depth will allow for the bulk of the heating to occur within about the top 4 μm of the surface. Increased thermal isolation of each diode/pixel can be obtained by forming, e.g., etching or cutting, wells in the substrate or by depositing a low thermally conductive material, e.g., silicon dioxide, between the diodes. Optimizing pixel size will result in a relatively uniform temperature across the pixel's surface.

External biasing of the array is required to the base of the hysteresis curve, about 50° C. as shown in FIG. 1. This biasing is provided by an external source, such as a thermoelectric cooler, which heats the diodes to a first temperature (~50° C.) which is just below a second temperature which is the point of transition of the VO compound to an increased or higher reflective value, i.e., the bias point allows the array to achieve the greatest reflective contrast with the VO compound.

As power is provided to one of the diodes or pixels, the diode p-n junction will heat causing the reflective value of the VO compound deposited on the diode to increase. This scheme means that the reflectivity of the VO is directly proportional to the input current of the diode. As shown in FIG. 3, a constant power input is required to maintain a higher reflective value. Removing the current will allow the diode's reflectivity to decrease to its lowest value. Studies of thermal switching times indicate that the diodes should be operated in the avalanche breakdown mode. The rise and fall times of the thermal pulses are one of the limiting factors in the recycle rate of the SLM.

Heat control, i.e., dissipation, is particularly important as the density of the pixels in the SLM increases, in order to achieve the SLM goals of large array configuration, large optical contrast and high refresh rate. Heat dissipation can be enhanced by the addition of a heat sink to the base of the substrate. However, the addition of certain heat sinks will limit SLM operation to the reflective mode. Even in reflective mode, neither the connection between the array and the heat sink nor the heat sink itself can be reflective in the IR. Any reflectivity would partially mask the total reflective contrast of the VO compound.

Figure 4:
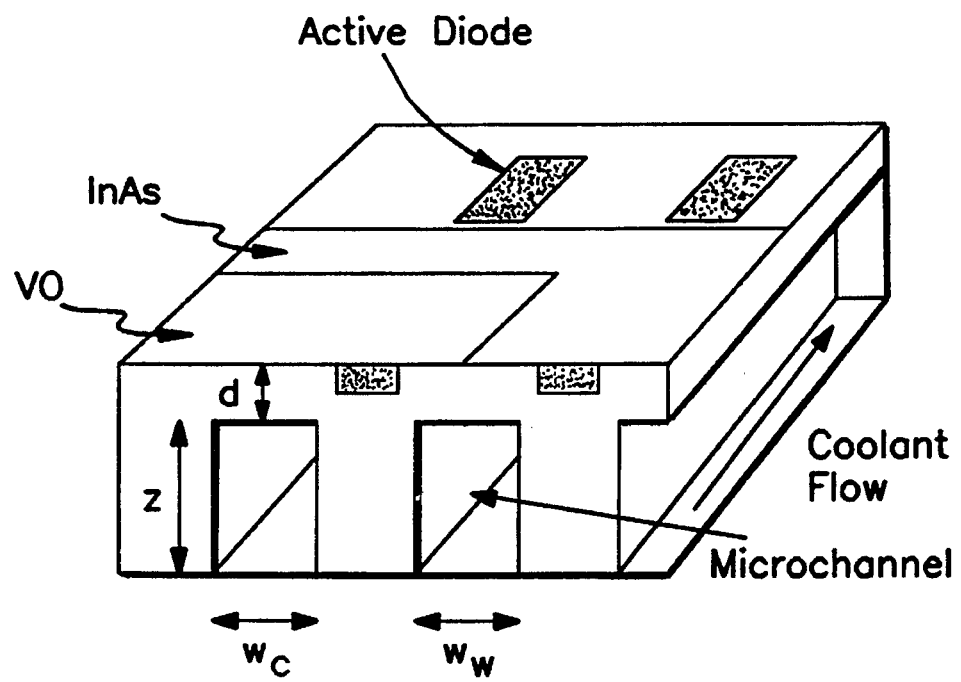
FIG. 4 illustrates the invention with a microchannel heat sink.
Figure 5:
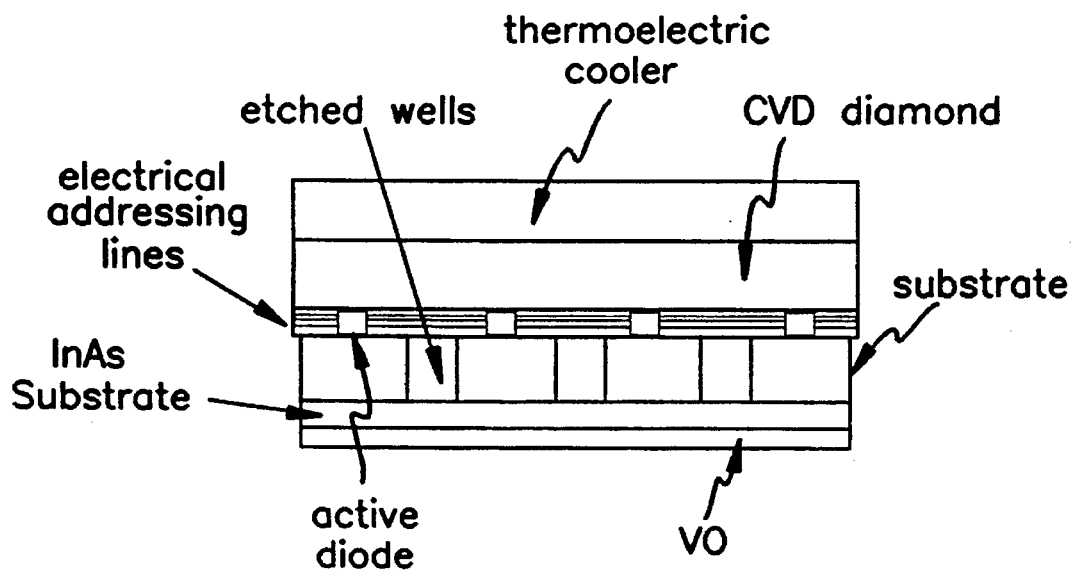
FIG. 5 illustrates the invention with a chemical vapor deposition (CVD) diamond heat sink.

FIGS. 4 and 5 illustrate, respectively, two techniques for heat dissipation: microchannels and chemical vapor deposition (CVD) diamond. Both techniques can remove power in excess of 100 W/cm$^2$ as is often required for surface-emitting laser diode arrays, high-energy-laser mirrors, and microelectronic devices. These heat dissipation requirements are similar to those anticipated for future large scale IR SLM devices. A uniform temperature across the surface of the SLM is required to accurately bias each of the diodes to the base of the VO compound's hysteresis curve. The heat sink also influences the maximum refresh rate of the SLM which is limited by the heating and cooling times of its individual pixels, and not the transition times of the VO compound.

The first heat sink design, shown in FIG. 4, relies on microchannel cooling to provide the required heat dissipation. The microchannel heat sink consists of channels to carry a coolant, in this embodiment each channel being of width $w_c$ and depth z separated by walls of width $w_w$ and formed, e.g., etched, in the silicon substrate in which the diodes are deposited. An alternative is to fabricate the diodes and microchannels in different materials and then-attach the materials.

The channels can be fabricated using an anisotropic etch. A borosilicate-glass cover plate can be anodically bonded or epoxied to the back side of the microchannels to confine the coolant to the channels. Slots are then machined in the glass to allow for coolant flow into and out of the channels.

Covering the diodes is a thin silicon dioxide layer (not shown) which provides electrical isolation. Attached to the top surface of the pixels is a second substrate with a high absorption coefficient in the IR, such as indium arsenide (InAs), which provides both a deposition substrate for the VO compound deposited thereon and a means of absorbing any incoming radiation transmitted by the VO compound. An additional antireflecting means, such as silicon dioxide, can be deposited on the InAs before the VO compound. This will further decrease reflectivity when the VO is transmissive and, hence, produce an even larger reflective contrast for the SLM between the VO's reflective and transmissive states.

Typical methods of attachment of the second substrate include solder and epoxy bonding, thermal grease, and gas layers. However, a microcapillary thermal interface may prove the most promising. The microcapillary interface provides a reusable, low-resistance interface allowing for the heat source and heat sink to be separated without being damaged. This technique would allow for the VO compound supporting (second) substrate to be easily removed from the diode array with different substrates optically optimized for different wavebands (within the 3–12 μm region). Use of a free-standing substrate will simplify the fabrication of the SLM.

The second SLM heat sink design (FIG. 5) incorporates a back-illuminated diode array on a substrate mounted to a CVD diamond wafer on a thermoelectric cooler (TEC), the TEC being used to bias the VO compound to the base of its hysteresis curve. Control of the diodes in the array is provided by electrical addressing lines (contacts) deposited in a thin silicon dioxide layer, required for electrical isolation, located between the silicon and CVD diamond substrates. The forming of "wells" or the placement of a low thermally conductive material between pixels of the SLM is required to achieve thermal isolation. These "wells" can be anisotropically etched in the silicon substrate. An IR absorbing wafer with a VO compound is attached to the surface of the diode array.

The second and third embodiments of the invention both consist of a VO compound thin film deposited on a thermoelectric array. Use of a thermoelectric array allows for the SLM to be operated in a bistable mode. As shown in FIG. 1, bistable operation requires biasing of the thermoelectric array to a first temperature at the center of the VO compound hysteresis curve, about 60° C. This is about half way between a second and third temperature, the second temperature being the temperature at which the VO compound transitions to the increased reflective value, and the third temperature being the temperature at which the VO compound attains a maximum reflective value. From this bias temperature, which as with the diode embodiment allows the array to achieve the greatest reflective contrast with the VO compound, the pixels in the thermoelectric array can provide either a positive or negative temperature pulse, depending on the magnitude and polarity of the electrical current flow.

Unlike the diode array, where a constant energy flux must be provided to maintain a higher reflective state, the thermoelectric pixels require only a short pulse (see FIG. 3). The required pulse duration is limited only by the heating of the pixels. Switching from one reflective state to another requires only a "reset" temperature pulse.

Figure 6:
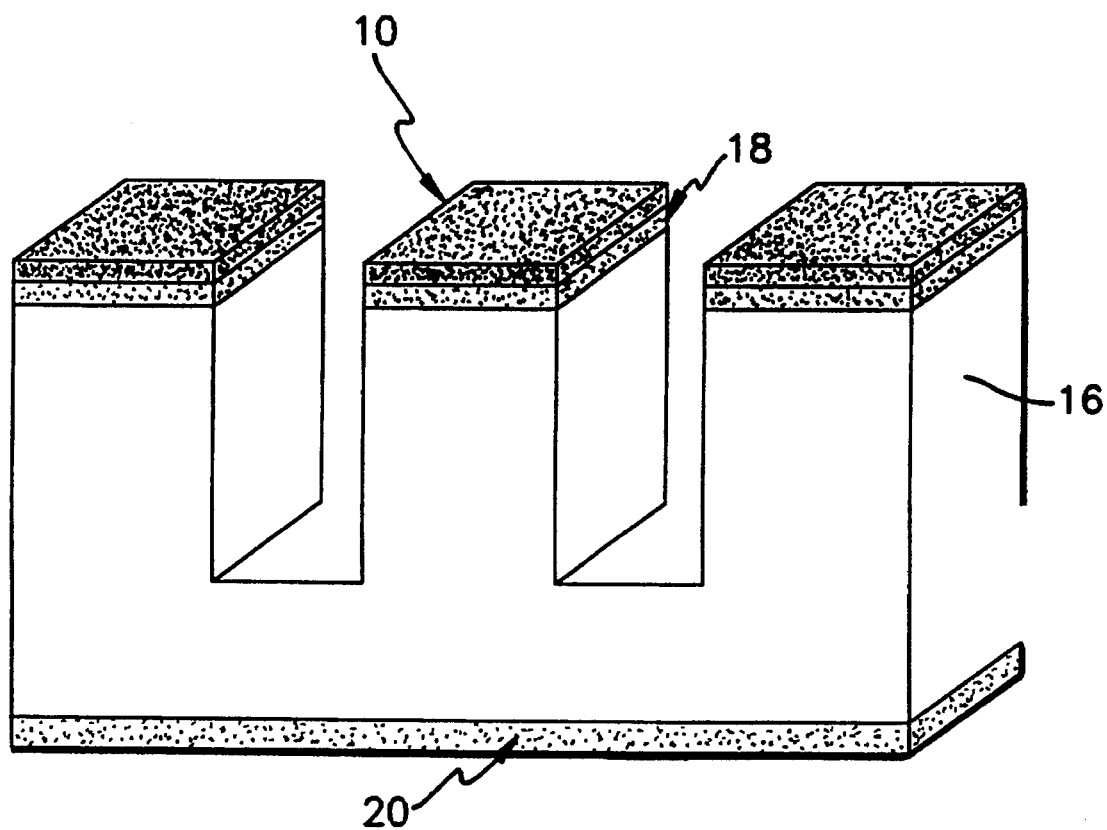
FIG. 6 illustrates one of two thermoelectric array embodiments of the invention.

The second embodiment and first thermoelectric array design is shown in FIG. 6. The array of pixels in the design is fabricated from either a p or n doped material substrate 16. Electrical contacts 18, 20 to the individual array pixels are deposited, respectively, on the top of each array pixel and on the array's base. A VO compound thin film 10, preferably $VO_2$, is deposited on the surface, i.e., the side of the electrical contact 18 opposite from the pixel array. Each array pixel is a thermoelectric cooler/heater, the pixel being controlled by the direction and magnitude of the electrical current that is passed between the electrical contacts. Heating/cooling of the array pixel causes the heating/cooling of the VO compound deposited thereon resulting in the increase/decrease of the reflective value of the VO compound. Increased thermal isolation of the pixels can be obtained by forming, e.g., etching/cutting, wells or depositing a low thermally conductive material, e.g., silicon dioxide, between the individual pixels.

In this second embodiment, the thermoelectric array substrate is a semiconductor fabricated from a silicon-germanium (SiGe) alloy chosen because of its excellent thermoelectric properties. Although no data has been found on its IR absorption characteristics, both of its constituents, Si and Ge, are known to be highly transmissive.

Figure 7:
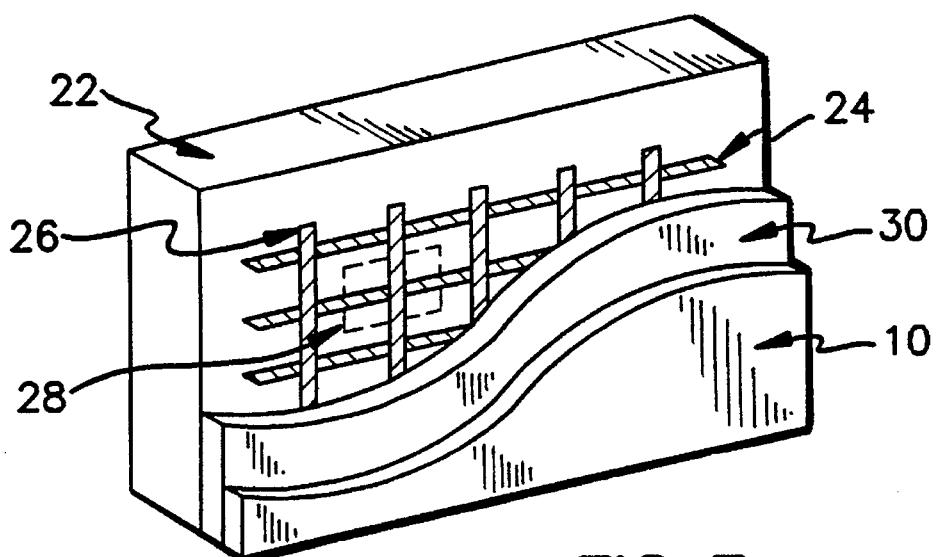
FIG. 7 illustrates the second of the two thermoelectric array embodiments of the invention.

The second thermoelectric array and third embodiment of the invention, as shown in FIG. 7, consists, in part, of a semiconductor substrate 22, preferably silicon or silicon-germanium, which is transparent in the region of operation and will allow building the thermoelectric array from the substrate. The thermoelectric array is created with an array of doped lines of p and n type material 24, 26. The p doped lines are perpendicular to the n doped lines, thereby creating an array of p-n junctions. Each p-n junction 28 is a thermoelectric cooler/heater and constitutes a pixel in the array. A layer of electrically insulating material 30 is deposited on the p-n junction array with a VO compound thin film 10, deposited on the insulating layer.

As with the prior thermoelectric array design, this array must be biased to a first temperature at the center of the VO compound's hysteresis curve with the second and third temperatures being the same as in the prior design (second embodiment). This third embodiment also operates in the same manner as the second embodiment, i.e., the heating/cooling of p-n junctions causes the heating/cooling of the VO compound deposited on the p-n junctions thereby resulting in an increase/decrease of the VO compound's reflective value.

There are several advantages to using a thermoelectric array to switch the VO compound film. The thermoelectric array allows for electrical addressing of the pixels by addressing the individual rows and columns, and it allows one to take advantage of the bistability of the VO compound film in a dynamic system.

Control of the SLM about a VO compound's hysteresis in the fourth embodiment of the invention is provided by an array of vertical-cavity surface-emitting lasers (VCSELs). VCSELs are being developed for use in lightwave communication as well as in optoelectronics. As with double heterostructure (DH) semiconductor lasers, VCSELs emit light when a current is passed through their junction. This arrangement allows for easy modulation of the output radiation. The most obvious difference between the DH laser and VCSEL is how the input current is applied. For the DH laser, the current flow is perpendicular to the output radiation, while in the VCSEL, the current and output radiation are parallel. This is a very critical distinction, and is what permits the fabrication of a two-dimensional addressable array of the VCSELs.

Figure 8:
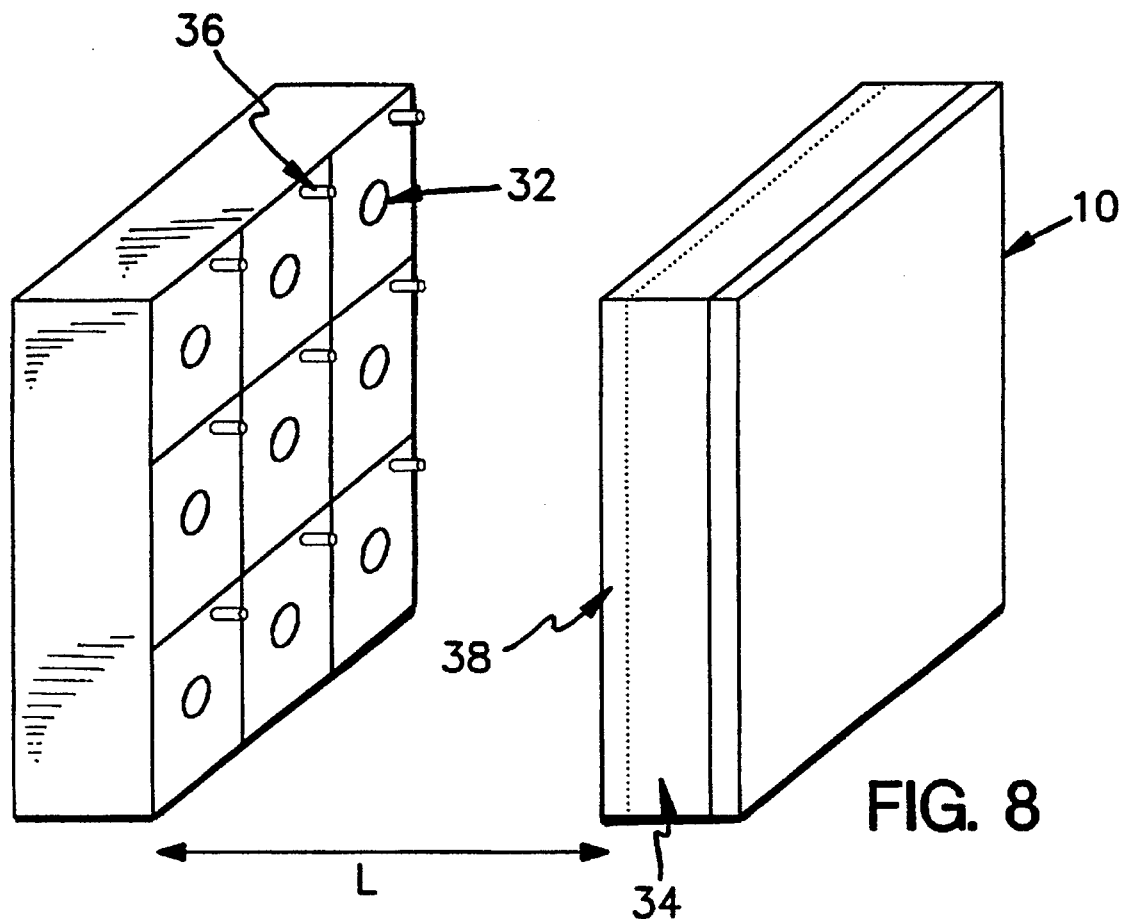
FIG. 8 illustrates the vertical-cavity surface-emitting laser embodiment of the invention.

As shown in FIG. 8, the invention comprises a two-dimensional array of VCSELs 32. Each VCSEL in the array is addressed by a surface mounted electrical contact 36. It is this feature that makes a two-dimensional array possible.

A semiconductor substrate 34, preferably silicon, with a VO compound thin film 10 deposited on the front of the substrate, i.e., the side opposite from the VCSEL array, is spaced a distance, L, from the VCSEL array. Silicon was chosen for the substrate because of its high absorption of wavelengths below about 1.1 μm. High absorption in this band is required for the VCSELs to quickly heat the silicon. The thermal heating of the silicon is critical in determining the maximum frame rate of the SLM. Silicon also benefits from its relatively high thermal conductivity. Current VCSEL designs have obtained output powers of around 3.0 mW.

When the input electrical current to one of the VCSELs exceeds the threshold current, lasing occurs. An active laser will provide localized thermal heating to the silicon substrate. This localized heating causes the VO compound, preferably $VO_2$, to switch from a state of low to high reflectivity in the IR. It is the localized switching of the $VO_2$ that forms the pixels of the SLM.

The separation, L, between the VCSEL array and the silicon substrate allows for the emitted laser beam to expand. The distance, L, provides a means of controlling the spot size of the beam on the silicon substrate. This spot size is directly proportional to the pixel size of the SLM. To increase the pixel size, the separation between adjacent VCSELs and the silicon substrate must be increased. VCSEL arrays have been reported with center to center separations of 20 μm and facet sizes of 10 μm. An array of this size would allow a minimum pixel size of 20 μm.

The output power of each VCSEL is controlled by the input electrical current. Modulation of each laser's output power will control the silicon substrate's temperature, allowing for accurate movement about the $VO_2$ hysteresis curve. This modulation can occur well into the MHz range, meaning that switching times of the SLM pixels is limited only by the heating and cooling of the silicon substrate.

As noted above, $VO_2$ thin films exhibit a temperature dependent hysteresis about a transitional or second temperature of approximately 60° C. A first or bias temperature for the silicon substrate is required to the base of the $VO_2$'s hysteresis, about 50° C. Biasing of the substrate to the first temperature is accomplished by passing a fluid between the VCSEL array and the silicon substrate. The fluid not only provides a bias to the base of the hysteresis, but acts as a heatsink as well. A good heatsink is essential in maintaining thermal uniformity across the array.

A first antireflecting (AR) coating 38 is added to the rear of the substrate (the side opposite from the VO compound) so that limited radiation is reflected by the silicon. Any reflected radiation could degrade the performance of the VCSELs and limit their total output power. A second AR coating can also be placed on the front surface of the silicon substrate and VO compound. The VO compound alone, or in conjunction with one or more dielectric films, e.g., silicon dioxide, can be used to limit the total reflected radiation off the front surface when the VO compound is in its low reflective mode. The AR coating reduces the reflectance in the SLM "off" state which increases the overall contrast ratio of the device when compared to the high reflectivity of the "on" state. If near zero reflectance is achieved, the VO compound film could exhibit an almost infinite contrast ratio. This second AR coating can be used with all embodiments of the invention not just with the VCSEL embodiment.

One very important application of the invention's ability to spatially modulate the amplitude of a beam of IR light is as an IR scene simulator. The ability to project dynamic IR scenes for the purpose of testing and evaluating IR seekers is of crucial importance in the assessment of seeker performance under realistic conditions of target dynamics, backgrounds, and countermeasures.

In addition to its use for IR dynamic scene simulation, the invention can also be used for optical processing. This results from the memory produced by the hysteresis for the transition from dielectric to conductor at the transition temperature. For optical processing, the invention could be used as an incoherent-to-coherent converter so that subsequent operations could be performed as in a conventional Vander Lugt matched filter configuration.

Another use of the invention is as a predetection processor for an IR seeker in which the SLM would be employed at an image plane that is intermediate to the image plane of the detector. The SLM, therefore, can perform a dynamic filtering operation prior to the detection process. Such a configuration would prove useful in target recognition algorithms.

We claim:

1. A device for modulating light as a function of spatial position comprising:

a substrate;

an array of temperature changing means deposited on the substrate; and a thin film comprising a vanadium oxide (VO) compound, the VO compound being deposited on the temperature changing means array;

wherein, when an electrical current is applied to a temperature changing means, the temperature changing means changes temperature thereby changing the reflective value of the VO compound deposited on the temperature changing means.

2. The device as recited in claim 1, wherein the array of temperature changing means comprises an array of p-n junctions.

3. A device for modulating light as a function of spatial position comprising:

a substrate;

an array of heating means deposited on the substrate; and a thin film comprising a vanadium oxide (VO) compound, the VO compound being deposited on the heating means array;

wherein, when an electrical current is applied to a heating means, the heating means heats the VO compound deposited on the heating means causing the reflective value of the VO compound to increase.

4. The device as recited in claim 3, wherein the array of heating means comprises an array of p-n junctions.

5. A device for modulating light as a function of spatial position comprising:

a substrate;

an array of diodes, each diode comprising a p-n junction and having electrical contacts, the diodes being deposited in the substrate and isolated electrically from each other; and a thin film comprising a vanadium oxide (VO) compound, the VO compound being deposited on the diode array;

wherein, when an electrical current is applied to a diode through the electrical contacts, the diode heats the VO compound deposited on the diode causing the reflective value of the VO compound to increase.

6. The device as recited in claim 5, wherein the substrate comprises a semiconductor.

7. The device as recited in claim 6, wherein the semiconductor is silicon.

8. The device as recited in claim 5, wherein the VO compound is vanadium dioxide.

9. The device as recited in claim 5, wherein the diode array is maintained at a first temperature, the first temperature being just below a second temperature, the second temperature being the temperature at which the VO compound transitions to the increased reflective value.

10. The device as recited in claim 5, further comprising means for thermally isolating the diodes.

11. The device as recited in claim 10, the thermally isolating means comprising a low thermally conductive material deposited between each diode.

12. The device as recited in claim 11, the low thermally conductive material comprising silicon dioxide.

13. The device as recited in claim 10, the thermally isolating means comprising a plurality of wells formed between each diode.

14. The device as recited in claim 5, further comprising a means for dissipating heat.

15. The device as recited in claim 14, the heat dissipating means comprising a plurality of channels formed in the substrate, the channels for carrying a coolant to dissipate the heat.

16. The device as recited in claim 14, the heat dissipating means comprising:

a second substrate, the second substrate being attached to the substrate on the side opposite from the diode array; and a plurality of channels formed in the second substrate, the channels for carrying a coolant to dissipate the heat.

17. The device as recited in claim 14, the heat dissipating means comprising a chemical vapor deposition (CVD) diamond.

18. The device as recited in claim 5, further comprising a means for absorbing radiation transmitted by the VO compound, the absorbing means being deposited between the diode array and the VO compound.

19. The device as recited in claim 5, further comprising an antireflecting coating deposited on the same side of the substrate as the VO compound to limit the radiation being reflected when the VO compound is in a low reflective mode.

20. A device for modulating light as a function of spatial position comprising:
   a substrate comprising an array of pixels;
   a first electrical contact deposited on the base of the pixel array;
   a second electrical contact deposited on the top of the pixel array; and
   a thin film comprising a vanadium oxide (VO) compound, the VO compound being deposited on the opposite side of the second electrical contact from the pixel array;
   wherein, when an electrical current is passed between the first and second electrical contacts, depending on the direction and magnitude of the electrical current, each array pixel becomes a thermoelectric heater/cooler, each array pixel heating/cooling the VO compound deposited on each array pixel causing the reflective value of the VO compound to increase/decrease, respectively.

21. The device as recited in claim 20, wherein the substrate comprises a semiconductor.

22. The device as recited in claim 21, wherein the semiconductor comprises a silicon-germanium alloy.

23. The device as recited in claim 20, further comprising means for thermally isolating the pixels.

24. The device as recited in claim 23, the thermally isolating means comprising a low thermally conductive material deposited between each pixel.

25. The device as recited in claim 24, the low thermally conductive material comprising silicon dioxide.

26. The device as recited in claim 23, the thermally isolating means comprising a plurality of wells formed between each pixel.

27. The device as recited in claim 20, wherein the pixels are maintained at a first temperature, the first temperature being half way between a second temperature and a third temperature, the second temperature being the temperature at which the VO compound transitions to the increased reflective value, and the third temperature being the temperature at which the VO compound attains a maximum reflective value.

28. The device as recited in claim 20, wherein the VO compound is vanadium dioxide.

29. A device for modulating light as a function of spatial position comprising:
   a substrate;
   an array of p-n junctions comprising an array of doped lines of p and n type material, the p doped lines being perpendicular to the n doped lines, each p-n junction acting as a thermoelectric heater/cooler;
   a layer of electrically insulating material deposited on the p-n junction array; and
   a thin film comprising a vanadium oxide (VO) compound, the VO compound being deposited on the layer of electrically insulating material;
   wherein, when an electrical current is passed through a p-n junction, depending on the direction and magnitude of the electrical current, each p-n junction becomes a thermoelectric heater/cooler, each p-n junction heating/cooling the VO compound deposited on the p-n junction causing the reflective value of the VO compound to increase/decrease, respectively.

30. The device as recited in claim 29, wherein the substrate comprises a semiconductor.

31. The device as recited in claim 30, wherein the semiconductor comprises silicon-germanium.

32. The device as recited in claim 29, wherein the p-n junction array is maintained at a first temperature, the first temperature being half way between a second temperature and a third temperature, the second temperature being the temperature at which the VO compound transitions to the increased reflective value, and the third temperature being the temperature at which the VO compound attains a maximum reflective value.

33. The device as recited in claim 29, wherein the VO compound is vanadium dioxide.

34. A device for modulating light as a function of spatial position comprising:
   an array of vertical-cavity surface-emitting lasers (VCSELs), each VCSEL having an electrical contact;
   a substrate spaced a distance from the VCSEL array; and
   a thin film comprising a vanadium oxide (VO) compound, the VO compound being deposited on the opposite side of the substrate from the VCSEL array;
   wherein, when an electrical current to a VCSEL exceeds a threshold current lasing occurs providing localized heating to the substrate and thereby to the VO compound deposited on the substrate, causing the reflective value of the VO compound to increase.

35. The device as recited in claim 34, wherein the substrate comprises a semiconductor.

36. The device as recited in claim 35, wherein the semiconductor comprises silicon.

37. The device as recited in claim 34, wherein the substrate and the VO compound are maintained at a first temperature, the first temperature being just below a second temperature, the second temperature being the temperature at which the VO compound transitions to the increased reflective value.

38. The device as recited in claim 37, wherein the substrate and the VO member are heated to the first temperature by passing a fluid between the VCSEL array and the substrate.

39. The device as recited in claim 34, wherein the VO compound is vanadium dioxide.

40. The device as recited in claim 34, further comprising a first antireflecting coating deposited on the opposite side of the substrate from the VO compound to limit the radiation being reflected by the substrate.

41. The device as recited in claim 34, further comprising a second antireflecting coating deposited on the same side of the substrate as the VO compound to limit the radiation being reflected by the same side when the VO compound is in a low reflective mode.

42. A method for modulating light as a function of spatial position comprising the step of
   changing the reflective value of a thin film of a vanadium oxide compound deposited on a temperature changing means array by providing an electrical current to the temperature changing means array, the temperature changing means array changing the temperature of the vanadium oxide compound.

43. A method for modulating light as a function of spatial position comprising the step of
   increasing the reflective value of a thin film of a vanadium oxide compound deposited on a heating means array by providing an electrical current to the heating means array, the heating means array heating the vanadium oxide compound.

44. A method for modulating light as a function of spatial position comprising the step of
   increasing the reflective value of a thin film of a vanadium oxide compound deposited on a diode array by providing an electrical current to the diode array, the diode array heating the vanadium oxide compound.

45. A method for making a device for modulating light as a function of spatial position comprising the steps of:
   depositing an array of temperature changing means on a substrate; and
   depositing a thin film of a vanadium oxide compound on the temperature changing means array;
   wherein, when an electrical current is applied to a temperature changing means, the temperature changing means changes the temperature of the vanadium oxide compound causing the reflective value of the vanadium oxide compound to change.

46. A method for making a device for modulating light as a function of spatial position comprising the steps of:
   depositing an array of heating means on a substrate; and
   depositing a thin film of a vanadium oxide compound on the heating means array;
   wherein, when an electrical current is applied to a heating means, the heating means heats the vanadium oxide compound deposited on the heating means causing the reflective value of the vanadium oxide compound to increase.

47. A method for making a device for modulating light as a function of spatial position comprising the steps of:
   depositing an array of diodes in a substrate, each diode comprising a p-n junction and having an electrical contact, the diodes being electrically isolated from each other; and
   depositing a thin film of a vanadium oxide compound on the diode array;
   wherein, when an electrical current is applied to a diode, the diode heats the vanadium oxide compound deposited on the diode causing the reflective value of the vanadium oxide compound to increase.

* * * * *